(12) United States Patent
Chang et al.

(10) Patent No.: US 7,977,791 B2
(45) Date of Patent: Jul. 12, 2011

(54) SELECTIVE FORMATION OF BORON-CONTAINING METAL CAP PRE-LAYER

(75) Inventors: Hui-Lin Chang, Hsinchu (TW);
Yung-Cheng Lu, Taipei (TW);
Syun-Ming Jang, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 1036 days.

(21) Appl. No.: 11/775,098

(22) Filed: Jul. 9, 2007

(65) Prior Publication Data
US 2009/0014877 A1  Jan. 15, 2009

(51) Int. Cl.
*H01L 23/48* (2006.01)
*H01L 23/52* (2006.01)
*H01L 29/40* (2006.01)
*H01L 21/44* (2006.01)

(52) U.S. Cl. ......... 257/751; 257/E21.576; 257/E21.591; 438/687

(58) Field of Classification Search .......... 257/751, 257/E21.576; 438/687
See application file for complete search history.

(56) References Cited

U.S. PATENT DOCUMENTS

| 4,435,443 | A | * | 3/1984 | Imai et al. ............. 204/192.25 |
| 2002/0029748 | A1 | * | 3/2002 | Kuwada et al. ............. 118/724 |
| 2003/0181035 | A1 | * | 9/2003 | Yoon et al. ................. 438/653 |
| 2004/0166603 | A1 | * | 8/2004 | Carley ......................... 438/52 |
| 2005/0082385 | A1 | * | 4/2005 | Kuwada et al. ............. 239/128 |
| 2006/0105570 | A1 | * | 5/2006 | Hautala et al. ............. 438/687 |
| 2007/0228571 | A1 | * | 10/2007 | Yu et al. ..................... 257/758 |
| 2008/0003796 | A1 | | 1/2008 | Jeong et al. |

FOREIGN PATENT DOCUMENTS
KR  100705936 B1  4/2007
* cited by examiner

*Primary Examiner* — Kiesha R Bryant
*Assistant Examiner* — Igwe U Anya
(74) *Attorney, Agent, or Firm* — Slater & Matsil, L.L.P.

(57) ABSTRACT

An interconnect structure with improved reliability is provided. The interconnect structure includes a semiconductor substrate; a dielectric layer over the semiconductor substrate; a metallic wiring in the dielectric layer; a pre-layer over the metallic wiring, wherein the pre-layer contains boron; and a metal cap over the pre-layer, wherein the metal cap contains tungsten, and wherein the pre-layer and the metal cap are formed of different materials.

20 Claims, 5 Drawing Sheets

SELECTIVE FORMATION OF BORON-CONTAINING METAL CAP PRE-LAYER

TECHNICAL FIELD

This invention is related generally to integrated circuits, and more particularly to structures and formation methods of interconnect structures, and even more particularly to the formation of metal caps on copper features.

BACKGROUND

A commonly used method for forming metal lines and vias is known as "damascene." Generally, this method involves forming an opening in a dielectric layer, which separates the vertically spaced metallization layers. The opening is typically formed using conventional lithographic and etching techniques. After the formation, the opening is filled with copper or copper alloys to form a via or a trench. Excess metal material on the surface of the dielectric layer is then removed by chemical mechanical polish (CMP). The remaining copper or copper alloy forms vias and/or metal lines.

Copper has replaced aluminum because of its lower resistivity. However, copper still suffers from electro-migration (EM) and stress-migration (SM) reliability issues as geometries continue to shrink and current densities increase.

FIG. 1 illustrates a cross-sectional view of an intermediate stage in the formation of a conventional interconnect structure. Copper line 4 is formed in low-k dielectric layer 2. Etch stop layer (ESL) 6 is formed on the top surface of copper line 4 and low-k dielectric layer 2. The degradation in RC delay is a shortcoming of the structure shown in FIG. 1. ESL 6 typically has a higher dielectric constant (k value) than low-k dielectric layer 2. As a result, the parasitic capacitances between the metal lines are increased, which results in the increase in RC delay.

FIG. 2 illustrates an improved interconnect structure, wherein metal cap 8 is formed on copper line 4. Metal cap 8 is typically formed of materials suffering less from electro-migration and stress-migration, for example, CoWP, tantalum, titanium, tungsten, and combinations thereof. This layer improves the reliability of the interconnect structure by reducing copper surface migration. It has been found that under stressed conditions, the mean time to failure (MTTF) of the interconnect structures with metal caps may be ten times greater than that of the interconnect structure shown in FIG. 1. With metal cap 8, the stress-induced void formation is significantly reduced. Additionally, parasitic capacitances are also reduced.

In addition to the characteristics discussed in the preceding paragraphs, the structures shown in FIGS. 1 and 2 suffer from other drawbacks. Copper line 4 and metal cap 8 are typically vulnerable to oxygen and/or chemical attacks, wherein oxygen and chemicals are introduced in the subsequent formation of the overlying low-k dielectric layers, etch stop layers, and the like. Additionally, for the structure shown in FIG. 2, the materials in metal cap 8 may adversely diffuse into the underlying copper line 4, causing an increase in the resistivity of copper line 4. Such an increase becomes a severe problem for future generations of integrated circuit, as the dimensions of the integrated circuits become increasingly smaller. Therefore, new structures and formation methods that overcome the deficiencies of the prior art are needed.

SUMMARY OF THE INVENTION

In accordance with one aspect of the present invention, an integrated circuit structure includes a semiconductor substrate; a dielectric layer over the semiconductor substrate; a metallic wiring in the dielectric layer; a pre-layer over the metallic wiring, wherein the pre-layer contains boron; and a metal cap over the pre-layer, wherein the metal cap contains tungsten, and wherein the pre-layer and the metal cap are formed of different materials.

In accordance with another aspect of the present invention, an integrated circuit structure includes a substrate; a low-k dielectric layer over the substrate; an opening extending from a top surface of the low-k dielectric layer into the low-k dielectric layer; a barrier layer lining the opening; a copper-containing conductive line in the opening and on the barrier layer; a pre-layer over, and adjoining, the copper-containing conductive line, wherein the pre-layer comprises a material selected from the group consisting essentially of boron and boron nitride; and a tungsten cap over, and adjoining, the pre-layer.

In accordance with yet another aspect of the present invention, a method for forming an integrated circuit structure includes providing a semiconductor substrate; forming a dielectric layer over the semiconductor substrate; forming a metallic wiring in the dielectric layer; forming a pre-layer over the metallic wiring, wherein the pre-layer comprises boron; and forming a metal cap over the pre-layer, wherein the metal cap comprises tungsten, and wherein the pre-layer and the metal cap are formed of different materials.

In accordance with yet another aspect of the present invention, a method for forming an integrated circuit structure includes providing a semiconductor substrate; forming a dielectric layer over the semiconductor substrate; forming a copper-containing line in the dielectric layer; performing a cleaning step using a cleaning gas comprising nitrogen and an element selected from the group consisting essentially of fluorine, chlorine, and combinations thereof; and forming a tungsten cap over the copper-containing line.

In accordance with yet another aspect of the present invention, a method for forming an integrated circuit structure includes providing a semiconductor substrate; forming a low-k dielectric layer over the semiconductor substrate; forming a copper-containing line in the low-k dielectric layer; and selectively forming a tungsten cap over the copper-containing line using precursors comprising $WF_6$ and $B_2H_6$.

The advantageous features of the present invention includes the improved reliability of interconnect structures due to increased resistance to oxygen and fluorine attacking, and the reduced copper line resistivity due to less undesirably diffusion from cap layers into the underlying copper lines.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Interconnect structures with improved reliability and methods of forming the same are provided. The intermediate stages of manufacturing preferred embodiments of the present invention are illustrated in FIGS. 3 through 8B. Throughout various views and illustrative embodiments of the present invention, like reference numbers are used to designate like elements.

Figure 1:
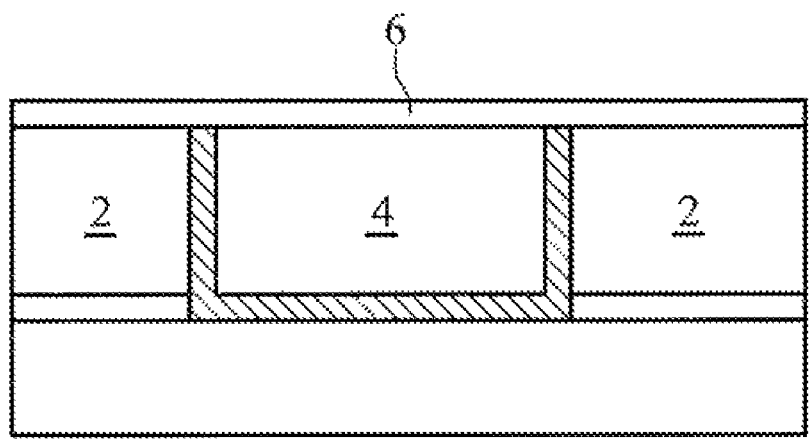
FIG. 1 illustrates a conventional interconnect structure in a low-k dielectric layer, wherein an etch stop layer is formed on a copper line.
Figure 2:
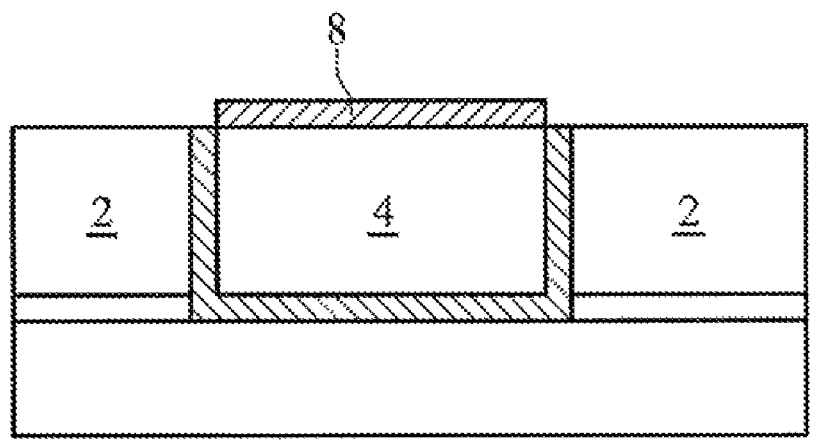
FIG. 2 illustrates a conventional interconnect structure in a low-k dielectric layer, wherein a metal cap layer is formed on a copper line.
Figure 3:
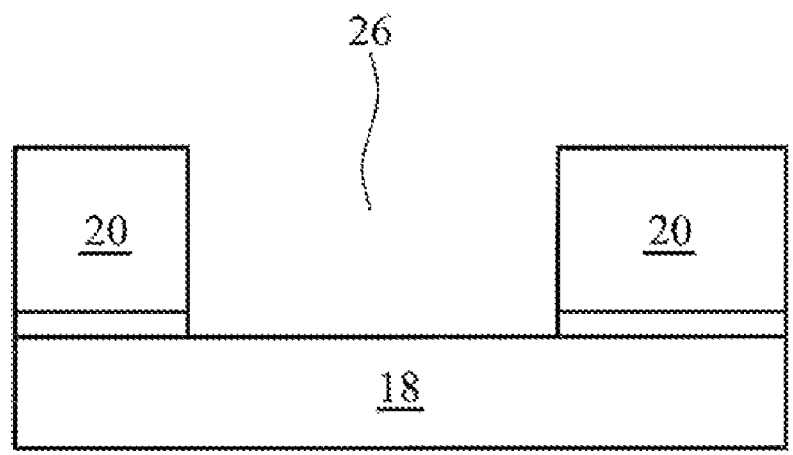
FIGS. 3 through 8B are cross-sectional views of intermediate stages in the manufacturing of embodiments of the present invention, wherein boron-containing pre-layers are formed between metal caps and copper lines.

FIG. 3 illustrates the formation of opening 26 in dielectric layer 20, which is further formed over a schematically illustrated base structure 18. Base structure 18 may include a semiconductor substrate and overlying layers such as contact etch stop layers, inter-layer dielectric, inter-metal dielectrics, vias, and metal lines formed therein (not shown). The semiconductor substrate may be a single crystalline or a compound semiconductor substrate. Active devices (not shown), such as transistors, may be formed on the semiconductor substrate. In an exemplary embodiment, dielectric layer 20 has a low dielectric constant (k value), preferably lower than about 3.0, hence is referred to as low-k dielectric layer 20 throughout the description. More preferably, low-k dielectric layer 20 has a k value of less than about 2.5, and hence it is sometimes referred to as an extreme low-k (ELK) dielectric layer. Low-k dielectric layer 20 may include commonly used materials such as carbon-containing dielectric materials, and may further contain nitrogen, hydrogen, oxygen, and combinations thereof.

Figure 4:
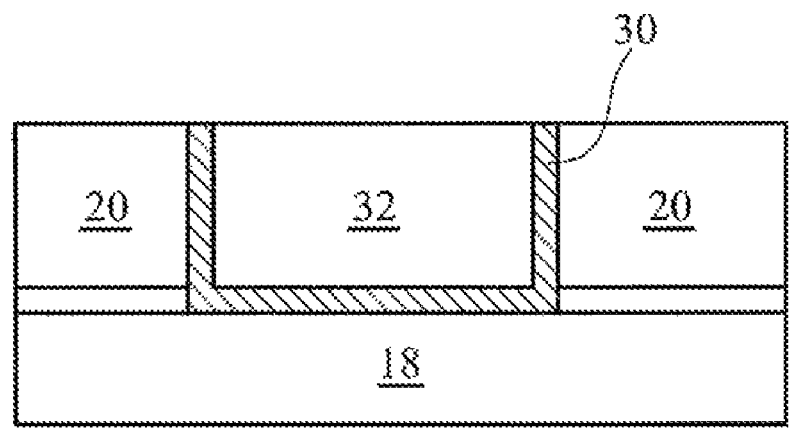

FIG. 4 illustrates the formation of (diffusion) barrier layer 30 for lining opening 26, and conductive line 32 in opening 26. Barrier layer 30 preferably includes titanium, titanium nitride, tantalum, tantalum nitride, or other alternatives, and may be formed using physical vapor deposition (PVD) or one of the chemical vapor deposition (CVD) methods. In an exemplary embodiment, the thickness of barrier layer 30 is between about 20 Å and about 200 Å. One skilled in the art will realize, however, that the dimensions recited throughout the description are related to the technology used for forming the integrated circuits, and will reduce accordingly with the down-scaling of the formation technology.

Conductive line 32 preferably includes copper or copper alloys. Throughout the description, conductive line 32 is alternatively referred to as copper line 32, although it may include other conductive materials, such as silver, gold, tungsten, aluminum, and the like. As is known in the art, the steps for forming barrier layer 30 and copper line 32 include blanket forming barrier layer 30; depositing a thin seed layer of copper or copper alloy on barrier layer 30; and filling opening 26 with a conductive material, such as copper, preferably by plating. A chemical mechanical polish (CMP) is then performed to remove excess conductive material, leaving only barrier layer 30 and copper line 32 in opening 26.

A pre-clean is first performed to the semiconductor structure shown in FIG. 4. In the preferred embodiment, the pre-clean is performed using a nitrogen-based cleaning gas, which further includes an element such as fluorine, chlorine, and combinations thereof. Exemplary pre-cleaning gases include $NF_3$, $NCl_3$, $NF_2Cl$, and combinations thereof. The pre-clean may be performed by placing the semiconductor structure in a chamber, and conducting the pre-cleaning gas through the chamber. In an exemplary embodiment, the pre-cleaning gas in the chamber has a flow rate of between about 10 sccm and about 10,000 sccm, the duration is between about 10 and about 300 seconds, and the pre-clean temperature is between about 100° C. and about 400° C. Experiment results have revealed that the pre-clean step has the function of improving selectivity in the subsequently performed metal cap formation. In the experiment, two samples were made with essentially the same process conditions. The pre-clean step was performed on the first sample, but not the second sample. It was found that the second sample had a severe selectivity loss, with noticeable metal cap materials undesirably deposited on low-k dielectric layer 20. The first sample, however, had a high selectivity with no noticeable metal cap material deposition on low-k dielectric layer 20.

A pretreatment is then performed to treat the surface of copper line 32. In the preferred embodiment, the pretreatment includes a hydrogen-based gas treatment in a production tool, such as one used for plasma enhanced chemical vapor deposition (PECVD). The hydrogen-based gases preferably include $H_2$, $NH_3$, and the like. The pretreatment has the function of reducing native copper oxide to copper and removing chemical contamination from copper line 32.

Figure 5:
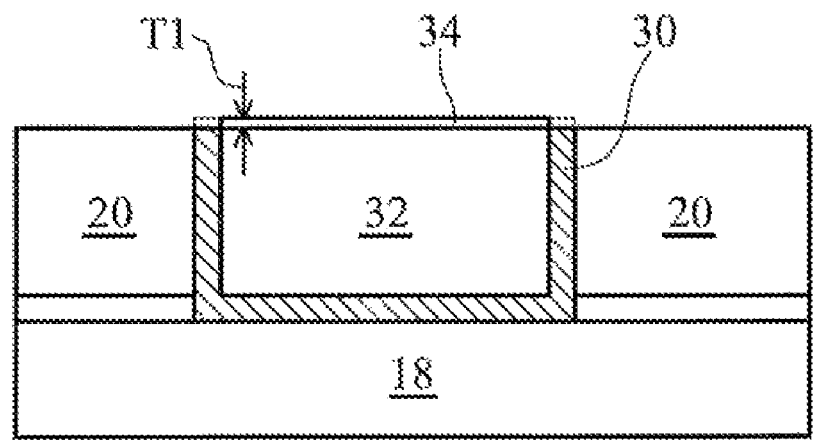

Referring to FIG. 5, pre-layer 34, which is a boron-containing layer, is formed. In the preferred embodiment, boron layer 34 is selectively deposited on copper line 32, but not on low-k dielectric layer 20. Pre-layer 34 may also extend on the top edge of barrier layer 30, as is illustrated by dashed lines. The reaction chamber for forming pre-layer 34 preferably includes precursors such as $B_2H_6$, and dilute gases such as $H_2$. The preferred formation method is atomic layer deposition (ALD), although other CVD methods can be used. In an exemplary embodiment, the temperature for the pre-layer deposition is between about 250° C. and about 450° C., the process duration is between about 3 seconds and about 600 seconds, and the gas pressure is between about 1 mtorr to about 10 torr. The resulting pre-layer 34, which is a boron layer, has a thickness T1 of between about 5 Å and about 100 Å.

Figure 6:
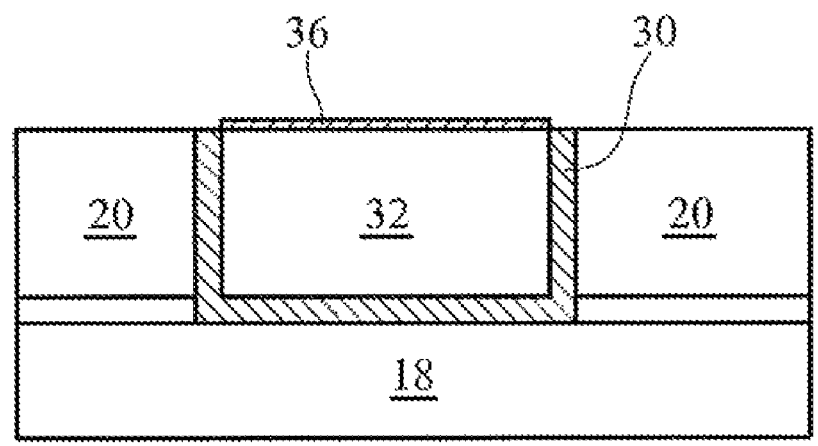

In an embodiment, a nitridation is performed to convert boron pre-layer 34 into boron nitride pre-layer 36, as is shown in FIG. 6. Advantageously, BN is more oxygen resistant than boron, and hence is more stable. The conversion is preferably performed by a plasma treatment using a nitrogen-containing gas, such as $N_2$, $NH_3$, and combinations thereof. In an exemplary embodiment, the temperature for the conversion is between about 100° C. and about 400° C., the process duration is between about 5 seconds and about 60 seconds, and the gas pressure is between about 1 mtorr to about 10 torr.

Alternatively, instead of forming boron pre-layer 34 and then converting pre-layer 34 to BN pre-layer 36, the BN pre-layer 36 may be formed directly using both $B_2H_6$ and a nitrogen-containing gas as precursors. The nitrogen-containing gas may include $N_2$, $NH_3$, and combinations thereof. In an exemplary embodiment, the temperature for the formation of BN pre-layer 36 is between about 250° C. and about 450° C., the process duration is between about 3 seconds and about 600 seconds, and the gas pressure is between about 1 mtorr to about 10 torr.

Figure 7A:
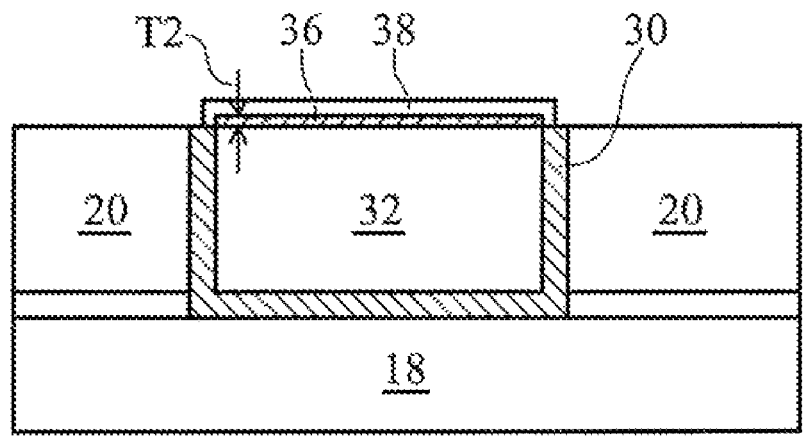

FIG. 7A illustrates the formation of metal cap 38 on pre-layer 36. In the preferred embodiment, metal cap 38 is a tungsten (W) cap, and thus is alternatively referred as tungsten cap 38, although other commonly used metal cap materials, such as tantalum (Ta), cobalt (Co), nickel (Ni), molybdenum (Mo), titanium (Ti), CoWP, CoB, and combinations thereof, may be used. Metal cap 38 is preferably formed selectively using electroless plating, during which the wafer including the structure shown in FIG. 6 is submerged in a plating solution. Alternatively, metal cap 38 may be blanket formed on copper line 32 and low-k dielectric layer 20, followed by etching undesirable portions. In the preferred embodiment, metal cap 34 extends onto top edges of diffusion barrier layer 30. Alternatively, metal cap 34 is only formed selectively on pre-layer 34 or 36.

In the preferred embodiment, tungsten cap 38 is formed using precursors containing $WF_6$ and $B_2H_6$, and dilute gases such as $N_2$, He, $H_2$, and combinations thereof. ALD is preferred due to its ability to form continuous layers, a desirable characteristic for metal caps. In other embodiments, tungsten cap 38 is formed using precursors containing $WF_6$ and $SiH_4$, and dilute gases such as $N_2$, He, $H_2$, and combinations thereof. In yet other embodiments, tungsten cap 38 is formed using precursors containing $W(CO)_6$, and dilute gases such as $N_2$, He, and combinations thereof. In an exemplary embodiment, the temperature for forming tungsten cap 38 is between about 100° C. and about 400° C., and more preferably between about 100° C. and 150° C. Experiment results revealed that a low temperature is beneficial for improving the deposition selectivity on copper and on low-k dielectric layer 20. The process duration is preferably between about 3 seconds and about 600 seconds, and the gas pressure is preferably between about 1 mtorr to about 10 torr. The thickness T2 of the resulting tungsten cap 38 may be between about 25 Å and about 200 Å.

Figure 7B:
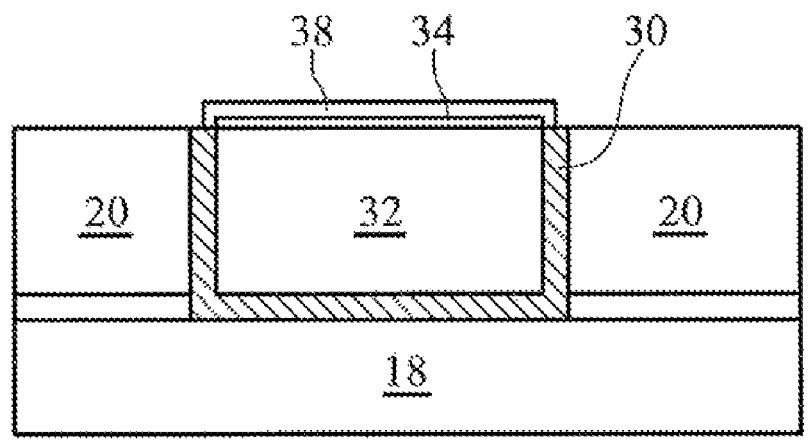

FIG. 7B illustrates an alternative embodiment, wherein metal cap 38 is formed on boron pre-layer 34 instead of BN pre-layer 36. The materials and process conditions are essentially the same as in the embodiment shown in FIG. 7A.

During the formation of tungsten cap 38, it is likely that a small amount of tungsten may be deposited on low-k dielectric layer 20 instead of pre-layer 34 or 36. Therefore, a post-clean is performed to remove the tungsten deposited on low-k dielectric layer 20. The post-clean may be performed using essentially the same process gases, and with essentially the same process conditions, as the pre-clean. Experiments revealed that the post-clean effectively removed the tungsten undesirably deposited on low-k dielectric layer 20.

After the formation of metal cap 38, a treatment may be performed. In an exemplary embodiment, the treatment is performed using process gases such as $H_2$, $NH_3$, and combinations thereof. The treatment may also be performed with plasma turned on. The exemplary process conditions include a plasma power of between about 200 W and about 1000 W, and a temperature of between about 275° C. and about 400° C.

Figure 8A:
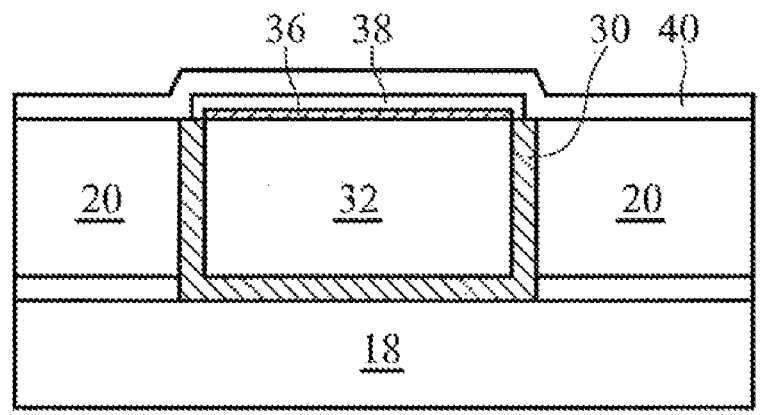

FIG. 8A illustrates the optional formation of etch stop layer 40. ESL 40 preferably has a dielectric constant of less than about 4.0, and may include carbon and/or nitrogen based materials such as silicon carbide, silicon nitride, silicon oxycarbide, silicon oxynitride, and combinations thereof. The thickness of ESL 40 is preferably less than about 800 Å. An experiment result has indicated an optimum thickness of about 100 Å.

Figure 8B:
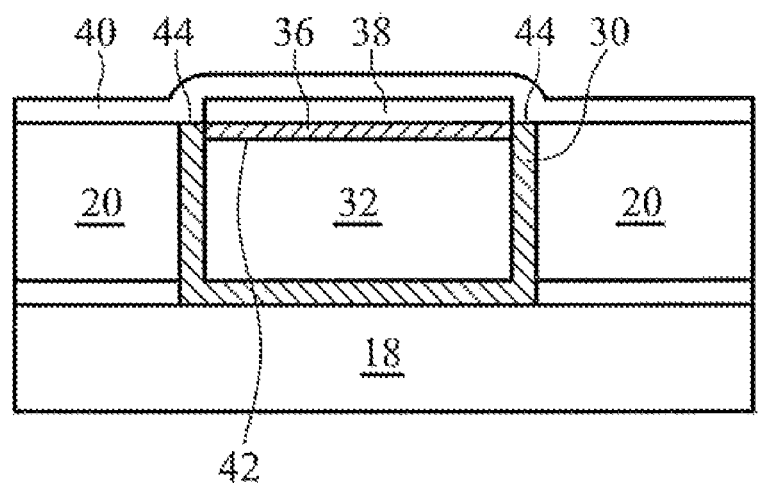

One skilled in the art will realize that the CMP and the pre-clean of copper line 32 may result in the recessing of the top surface 42 of copper line 32 below the top edges 44 of diffusion barrier layer 30. Accordingly, pre-layer 36 (or 34) may have at least a portion in the recess, as shown in FIG. 8B.

The embodiments of the present invention have several advantageous features. First, boron has a high activity, and thus may easily be formed selectively on copper, but not on low-k dielectric materials. Second, boron has a low copper solubility, and hence is less likely to diffuse into the underlying copper resulting in the undesirable increase in the resistivity of copper. Third, the boron or BN pre-layer is fluorine resistant, and thus may protect the underlying copper from the attack of fluorine, which is typically used in the formation of metal caps.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An integrated circuit structure comprising:
   a semiconductor substrate;
   a dielectric layer over the semiconductor substrate;
   a metallic wiring in the dielectric layer;
   a pre-layer over the metallic wiring, wherein the pre-layer comprises boron nitride; and
   a metal cap over the pre-layer, wherein the metal cap contains tungsten, and wherein the pre-layer and the metal cap are formed of different materials.

2. The integrated circuit structure of claim 1, wherein the pre-layer is substantially limited in a region directly over the metallic wiring.

3. The integrated circuit structure of claim 1, wherein the metal cap is a tungsten layer.

4. The integrated circuit structure of claim 1 further comprising an etch stop layer over the dielectric layer and the metal cap.

5. The integrated circuit structure of claim 1, wherein the pre-layer adjoins the metallic wiring and the metal cap.

6. An integrated circuit structure comprising:
   a substrate;
   a low-k dielectric layer over the substrate;
   an opening extending from a top surface of the low-k dielectric layer into the low-k dielectric layer;
   a barrier layer lining the opening;
   a copper-containing conductive line in the opening and on the barrier layer;
   a pre-layer over, and adjoining, the copper-containing conductive line, wherein the pre-layer comprises substantially pure boron nitride; and
   a tungsten cap over, and adjoining, the pre-layer.

7. The integrated circuit structure of claim 6 further comprising an etch stop layer over the dielectric layer and the tungsten cap.

8. A method for forming an integrated circuit structure, the method comprising:
   providing a semiconductor substrate;
   forming a dielectric layer over the semiconductor substrate;
   forming a metallic wiring in the dielectric layer;
   forming a pre-layer over the metallic wiring, wherein the pre-layer comprises boron;
   treating the pre-layer in a nitrogen-containing gas to convert boron into boron nitride; and
   forming a metal cap over the pre-layer, wherein the metal cap comprises tungsten, and wherein the pre-layer and the metal cap are formed of different materials.

9. The method of claim 8, wherein the step of forming the pre-layer is performed using $B_2H_6$ as a precursor.

10. The method of claim 8, wherein the step of forming the metal cap is performed using precursors comprising $WF_6$ and $B_2H_6$.

11. The method of claim 8, wherein the step of forming the metal cap is performed using precursors comprising $WF_6$ and $SiH_4$.

12. The method of claim 8, wherein the step of forming the metal cap is performed using precursors comprising $W(CO)_6$.

13. The method of claim 8 further comprising:
  before the step of forming the pre-layer, performing a pre-clean using a pre-cleaning gas, wherein the pre-cleaning gas comprises nitrogen and an element selected from the group consisting essentially of fluorine and chlorine.

14. The method of claim 8 further comprising:
  after the step of forming the metal cap, performing a post-clean using a post-cleaning gas, wherein the post-cleaning gas comprises nitrogen and an element selected from the group consisting essentially of fluorine and chlorine.

15. A method for forming an integrated circuit structure, the method comprising:
  providing a semiconductor substrate;
  forming a dielectric layer over the semiconductor substrate;
  forming a copper-containing line in the dielectric layer;
  performing a cleaning step using a cleaning gas comprising nitrogen and an element selected from the group consisting essentially of fluorine, chlorine, and combinations thereof;
  forming a tungsten cap over the copper-containing line; and
  forming a pre-layer between the metal cap and the copper line, wherein step of forming the pre-layer comprises forming a boron nitride layer, and wherein the step of forming the boron nitride layer comprises:
    depositing a boron layer on the copper line using a precursor comprising $B_2H_6$; and
    converting the boron layer into the boron nitride layer in a nitrogen-containing gas.

16. The method of claim 15, wherein the cleaning step is performed between the step of forming the copper-containing line and the step of forming the tungsten cap.

17. The method of claim 15, wherein the cleaning step is performed after the step of forming the tungsten cap.

18. The method of claim 15, wherein the cleaning step comprises a pre-clean and a post clean, each performed using the cleaning gas, and wherein the pre-clean is performed between the step of forming the copper-containing line and the step of forming the tungsten cap, and the post-clean is performed after the step of forming the tungsten cap.

19. The method of claim 15, wherein the cleaning gas comprises a gas selected from the group consisting essentially of $NF_3$, $NCl_3$, $NF_2Cl$, and combinations thereof.

20. The method of claim 15 further comprising forming a pre-layer between the metal cap and the copper line, wherein the pre-layer comprises a material selected from the group consisting essentially of boron and boron nitride.

* * * * *